US012622059B2

(12) United States Patent
Ye et al.

(10) Patent No.: US 12,622,059 B2
(45) Date of Patent: May 5, 2026

(54) ARRAY SUBSTRATE AND MANUFACTURING METHOD THEREOF, DISPLAY PANEL AND MANUFACTURING METHOD THEREFOR, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Chengzhi Ye, Beijing (CN); Binbin Cao, Beijing (CN); Yanming Lv, Beijing (CN); Hui An, Beijing (CN); Jinnian Ma, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 761 days.

(21) Appl. No.: 17/908,036

(22) PCT Filed: Sep. 30, 2021

(86) PCT No.: PCT/CN2021/122086
§ 371 (c)(1),
(2) Date: Apr. 6, 2023

(87) PCT Pub. No.: WO2023/050271
PCT Pub. Date: Apr. 6, 2023

(65) Prior Publication Data
US 2024/0213271 A1 Jun. 27, 2024

(51) Int. Cl.
*H10D 86/60* (2025.01)
*H10D 86/01* (2025.01)
*H10D 86/40* (2025.01)

(52) U.S. Cl.
CPC ......... *H10D 86/60* (2025.01); *H10D 86/0221* (2025.01); *H10D 86/0231* (2025.01);
(Continued)

(58) Field of Classification Search
CPC .... H10D 86/60; H10D 86/0221; H10D 86/01; H10D 86/0231; H10D 86/423;
(Continued)

(56) References Cited

U.S. PATENT DOCUMENTS 6,057,223 A * 5/2000 Lanford ............ H01L 21/76886
204/192.15
10,394,093 B2 8/2019 Chen
(Continued)

FOREIGN PATENT DOCUMENTS

CN 101330131 A 12/2008
CN 101330131 B 8/2010
(Continued)

OTHER PUBLICATIONS

Written Opinion from PCT/CN2021/122086 dated Apr. 28, 2022.
First Office Action of IN application No. 202227053451 dated Mar. 10, 2026.

*Primary Examiner* — Nikolay K Yushin
(74) *Attorney, Agent, or Firm* — Calfee, Halter & Griswold LLP

(57) ABSTRACT
The present disclosure relates to a manufacturing method for an array substrate, including: forming a first electrode material layer, a conductive enhancement material layer and a protective material layer in sequence, oxidation resistance of the protective material layer being stronger than that of the
(Continued)

Provide an array substrate, the array substrate being manufactured by the manufacturing method described above ⌐ S110

Provide a color filter substrate, and oppositely align the color filter substrate with the array substrate, the color filter substrate including a black matrix, and the orthographic projection of the conductive enhancement layer on the base substrate being located within an orthographic projection of the black matrix on the base substrate, and the orthographic projection of the protective layer on the base substrate being located within the orthographic projection of the black matrix on the base substrate ⌐ S210 conductive enhancement material layer; forming a mask pattern on a side of the protective material layer away from the first electrode material layer, the mask pattern including a first portion and a second portion, and a thickness of the first portion being greater than that of the second portion; performing ashing on the mask pattern to remove the second portion to expose the protective material layer covered by the second portion; patterning the first electrode material layer to form a first electrode; and patterning the protective material layer and the conductive enhancement material layer to form a protective layer and a conductive enhancement layer.

19 Claims, 8 Drawing Sheets

(52) U.S. Cl.
CPC ......... *H10D 86/423* (2025.01); *H10D 86/443* (2025.01); *H10D 86/471* (2025.01)

(58) Field of Classification Search
CPC .... H10D 86/40; H10D 86/443; H10D 86/471; H10D 86/00; H10D 86/441
See application file for complete search history.

(56) References Cited

U.S. PATENT DOCUMENTS

| | | |
|---|---|---|
| 10,782,571 B2 | 9/2020 | Cao |
| 11,049,888 B1 | 6/2021 | Zhu |
| 2016/0064414 A1 | 3/2016 | Choi |
| 2021/0225902 A1 | 7/2021 | Zhu |

FOREIGN PATENT DOCUMENTS

| | | |
|---|---|---|
| CN | 102629592 A | 8/2012 |
| CN | 205406523 U | 7/2016 |
| CN | 107004720 A | 8/2017 |
| CN | 108491103 A | 9/2018 |
| CN | 109119428 A | 1/2019 |
| CN | 109801929 A | 5/2019 |
| CN | 109801929 B | 7/2019 |

* cited by examiner

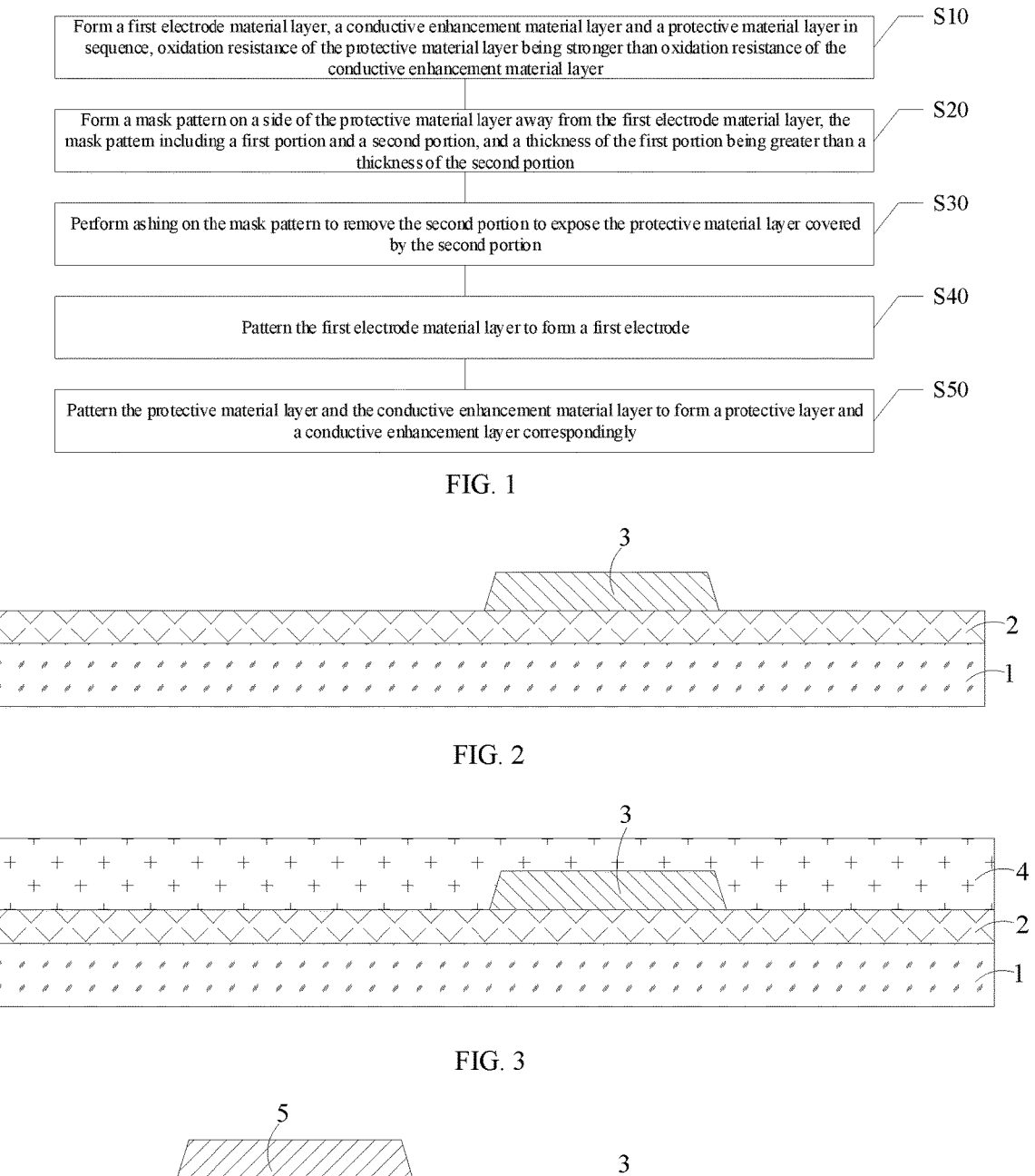

| S10 |
| Form a first electrode material layer, a conductive enhancement material layer and a protective material layer in sequence, oxidation resistance of the protective material layer being stronger than oxidation resistance of the conductive enhancement material layer |

| S20 |
| Form a mask pattern on a side of the protective material layer away from the first electrode material layer, the mask pattern including a first portion and a second portion, and a thickness of the first portion being greater than a thickness of the second portion |

| S30 |
| Perform ashing on the mask pattern to remove the second portion to expose the protective material layer covered by the second portion |

| S40 |
| Pattern the first electrode material layer to form a first electrode |

| S50 |
| Pattern the protective material layer and the conductive enhancement material layer to form a protective layer and a conductive enhancement layer correspondingly |

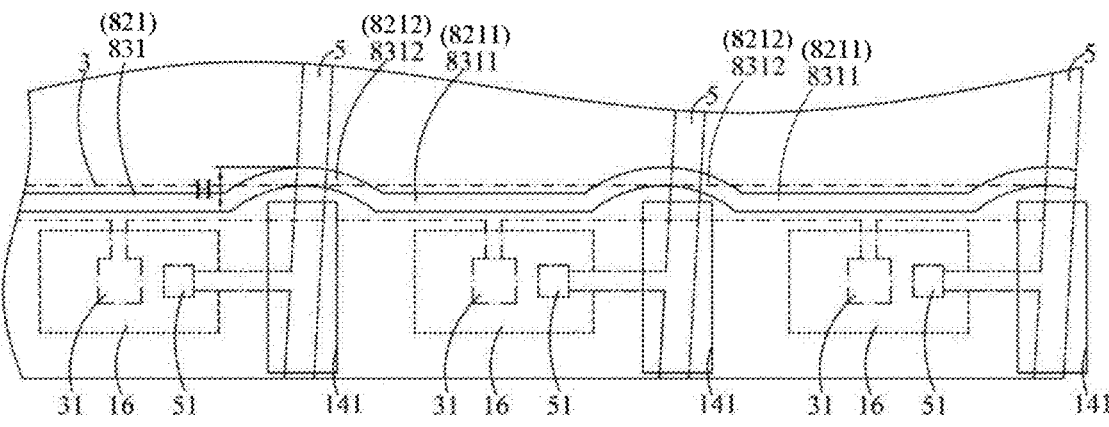

FIG.16

| | |
|---|---|
| Provide an array substrate, the array substrate being manufactured by the manufacturing method described above | S110 |

| | |
|---|---|
| Provide a color filter substrate, and oppositely align the color filter substrate with the array substrate, the color filter substrate including a black matrix, and the orthographic projection of the conductive enhancement layer on the base substrate being located within an orthographic projection of the black matrix on the base substrate, and the orthographic projection of the protective layer on the base substrate being located within the orthographic projection of the black matrix on the base substrate | S210 |

FIG. 17

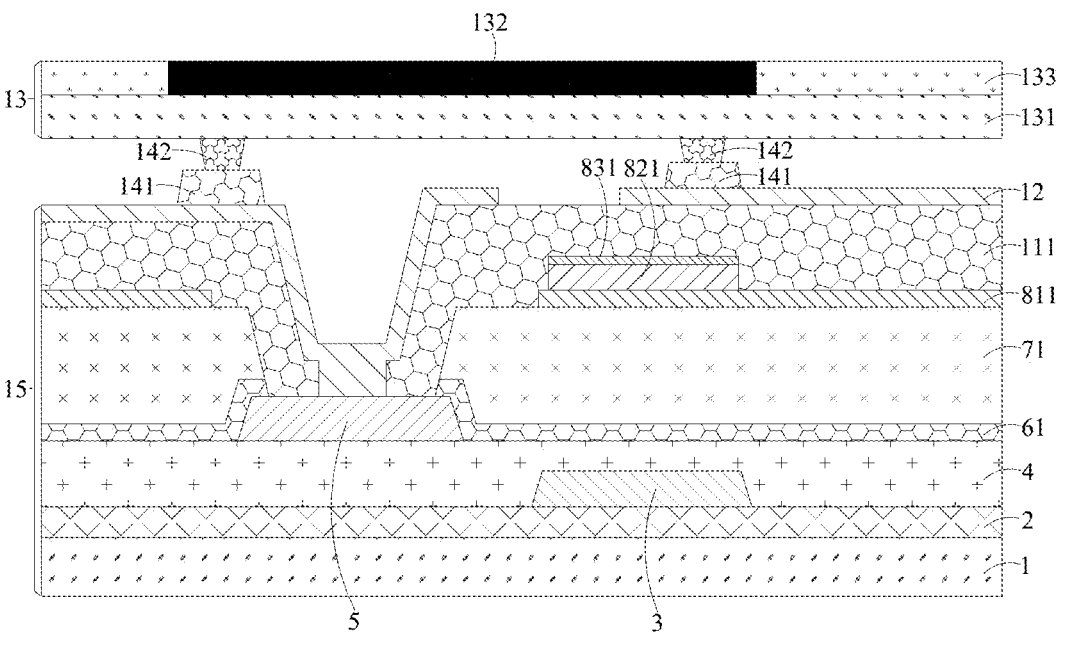

FIG. 18

ARRAY SUBSTRATE AND MANUFACTURING METHOD THEREOF, DISPLAY PANEL AND MANUFACTURING METHOD THEREFOR, AND DISPLAY DEVICE

TECHNICAL FIELD

The present disclosure relates to the field of display technologies, and in particular, to an array substrate and a manufacturing method for the array substrate, a display panel including the array substrate and a manufacturing method for the display panel, and a display device including the display panel.

BACKGROUND

In recent years, users have increasingly demanding requirements for display picture quality, which leads to the display picture quality of existing display products failing to meet the users' requirements.

It should be noted that the information disclosed in the Background section above is only for enhancing the understanding of the background of the present disclosure, and thus may include information that does not constitute prior art known to those of ordinary skill in the art.

SUMMARY

An objective of the present disclosure is to overcome the above-mentioned deficiencies of the prior art, and to provide an array substrate and a manufacturing method thereof, a display panel and a manufacturing method thereof, and a display device.

According to an aspect of the present disclosure, there is provided a manufacturing method for an array substrate, and the manufacturing method includes:

forming a first electrode material layer, a conductive enhancement material layer and a protective material layer in sequence, wherein oxidation resistance of the protective material layer is stronger than oxidation resistance of the conductive enhancement material layer;

forming a mask pattern on a side of the protective material layer away from the first electrode material layer, wherein the mask pattern includes a first portion and a second portion, and a thickness of the first portion is greater than a thickness of the second portion;

performing ashing on the mask pattern to remove the second portion to expose the protective material layer covered by the second portion;

patterning the first electrode material layer to form a first electrode; and patterning the protective material layer and the conductive enhancement material layer to form a protective layer and a conductive enhancement layer correspondingly.

In an embodiment of the present disclosure, before the performing the ashing on the mask pattern, the manufacturing method further includes:

patterning the protective material layer and the conductive enhancement material layer to expose a part of the first electrode material layer.

In an embodiment of the present disclosure, the forming the mask pattern on the side of the protective material layer away from the first electrode material layer includes:

forming a mask layer on the side of the protective material layer away from the first electrode material layer, and performing a half-mask process on the mask layer to form the mask pattern.

In an embodiment of the present disclosure, before the forming the first electrode material layer, the manufacturing method further includes:

forming an organic insulating material layer, and patterning the organic insulating material layer to form an organic insulating layer and a second via hole.

In an embodiment of the present disclosure, before the forming the first electrode material layer, the manufacturing method further includes:

forming a plurality of gate lines and a plurality of thin film transistors arranged in an array on a side of a base substrate, wherein an orthographic projection of the conductive enhancement layer on a base substrate is overlapped with an orthographic projection of a gate line on the base substrate, and an orthographic projection of the protective layer on the base substrate is overlapped with the orthographic projection of the gate line on the base substrate.

In an embodiment of the present disclosure, after the forming the protective layer and the conductive enhancement layer, the manufacturing method further includes:

forming a second insulating layer on a side of the protective layer away from the first electrode, and patterning the second insulating layer to form a fourth via hole; and forming a second electrode on a side of the second insulating layer away from the first electrode, wherein the second electrode is electrically coupled with a data line of the thin film transistor.

According to another aspect of the present disclosure, there is provided a manufacturing method for a display panel, and the manufacturing method includes:

providing an array substrate, wherein the array substrate is manufactured by the manufacturing method described in any one of the above embodiments; and providing a color filter substrate, and oppositely aligning the color filter substrate with the array substrate, wherein the color filter substrate includes a black matrix, and the orthographic projection of the conductive enhancement layer on the base substrate is located within an orthographic projection of the black matrix on the base substrate, and the orthographic projection of the protective layer on the base substrate is located within the orthographic projection of the black matrix on the base substrate.

According to another aspect of the present disclosure, there is provided an array substrate, and the array substrate includes:

a first electrode;

a conductive enhancement layer, disposed on a side of the first electrode; and a protective layer, disposed on a side of the conductive enhancement layer away from the first electrode, wherein oxidation resistance of the protective layer is stronger than oxidation resistance of the conductive enhancement layer.

In an embodiment of the present disclosure, an orthographic projection of the conductive enhancement layer on the first electrode is coincided with an orthographic projection of the protective layer on the first electrode.

In an embodiment of the present disclosure, the array substrate further includes:

a base substrate; and a plurality of thin film transistors and a plurality of gate lines, wherein the plurality of thin film transistor arrays are arranged in an array on a side of the base substrate, and an orthographic projection of the conductive enhancement layer on the base substrate is overlapped with an orthographic projection of a gate line on the base substrate, and an orthographic projections of the protective layer on the base substrate is overlapped with the orthographic projection of the gate line on the base substrate.

In an embodiment of the present disclosure, an extension direction of the conductive enhancement layer is consistent with an extension direction of the gate line, and the orthographic projection of the conductive enhancement layer on the base substrate is at least partially located within the orthographic projection of the gate line on the base substrate, an extension direction of the protective layer is consistent with the extension direction of the gate line, and the orthographic projection of the protective layer on the base substrate is at least partially located within the orthographic projection of the gate line on the base substrate.

In an embodiment of the present disclosure, the array substrate further includes:

a first spacer, disposed on a side of the first electrode away from the base substrate, and located between two adjacent thin film transistors; and the orthographic projection of the conductive enhancement layer on the base substrate is set as a curve, and the conductive enhancement layer is recessed and bent to a side away from the first spacer at a position of the conductive enhancement layer adjacent to the first spacer, the orthographic projection of the protective layer on the base substrate is set as a curve, and the protective layer is recessed and bent to the side away from the first spacer at a position of the protective layer adjacent to the first spacer.

In an embodiment of the present disclosure, the conductive enhancement layer includes a first straight portion and a first curved portion, and an orthographic projection of the first straight portion on the base substrate is located within the orthographic projection of the gate line on the base substrate, an orthographic projection of the first curved portion on the base substrate is at least partially not overlapped with the orthographic projection of the gate line on the base substrate; the protective layer includes a second straight portion and a second curved portion, an orthographic projection of the second straight portion on the base substrate is located within the orthographic projection of the gate line on the base substrate, and an orthographic projection of the second curved portion on the base substrate is at least partially not overlapped with the orthographic projection of the gate line on the base substrate.

In an embodiment of the present disclosure, a plurality of strips of conductive enhancement layers are disposed, and the plurality of strips of conductive enhancement layers are extended in a same direction; and a plurality of strips of protective layers are disposed, and the plurality of strips of protective layers are extended in a same direction.

In an embodiment of the present disclosure, the array substrate includes a thin film transistor and a data line, the extension direction of the conductive enhancement layer is consistent with an extension direction of the data line, and the orthographic projection of the conductive enhancement layer on the base substrate is at least partially within an orthographic projection of the data line on the base substrate, the extension direction of the protective layer is consistent with the extension direction of the data line, and the orthographic projection of the protective layer on the base substrate is at least partially within the orthographic projection of the data line on the base substrate.

In an embodiment of the present disclosure, the array substrate includes a thin film transistor and a gate line, the extension direction of the conductive enhancement layer is consistent with an extension direction of the gate line, and the conductive enhancement layer is located on a side of the thin film transistor away from the gate line, the extension direction of the protective layer is consistent with the extension direction of the gate line, and the protection layer is located on the side of the thin film transistor away from the gate line.

In an embodiment of the present disclosure, the array substrate further includes:

an organic insulating layer, disposed between the plurality of thin film transistors and the first electrode.

In an embodiment of the present disclosure, the array substrate further includes:

a second insulating layer, disposed on the side of the first electrode away from the base substrate; and a second electrode, disposed on a side of the second insulating layer away from the base substrate, wherein the second electrode is electrically coupled to a data line of the thin film transistor.

In an embodiment of the present disclosure, a material of the protective layer is a titanium alloy, and a thickness of the protective layer is greater than or equal to 300 A and less than or equal to 500 A.

In an embodiment of the present disclosure, the titanium alloy includes at least three metal materials.

In an embodiment of the present disclosure, a material of the conductive enhancement layer is copper, and a thickness of the conductive enhancement layer is greater than or equal to 1000 A and less than or equal to 1500 A.

In an embodiment of the present disclosure, the first electrode is a common electrode, and a material of the first electrode is ITO.

According to still another aspect of the present disclosure, there is provided a display panel, and the display panel includes:

an array substrate, wherein the array substrate is the array substrate described in any one of the above embodiments; and a color filter substrate, disposed opposite to the array substrate, wherein the color filter substrate includes a black matrix, and the orthographic projection of the conductive enhancement layer on the base substrate is located within an orthographic projection of the black matrix on the base substrate, and the orthographic projection of the protective layer on the base substrate is located within the orthographic projection of the black matrix on the base substrate.

According to still another aspect of the present disclosure, there is provided a display device, and the display device includes the above-mentioned display panel.

In the manufacturing method for the array substrate of the present disclosure, the protective material layer is formed on the side of the conductive enhancement material layer away from the first electrode material layer, and the oxidation resistance of the protective material layer is stronger than that of the conductive enhancement material layer; the mask pattern is formed on the side of the protective material layer away from the first electrode material layer, and the mask pattern includes the first portion and the second portion, the thickness of the first portion is greater than that of the second portion; ashing is performed on the mask pattern to remove the second portion to expose the protective material layer covered by the second portion; the first electrode material layer is patterned to form the first electrode; and the protective material layer and the conductive enhancement material layer are patterned to form the protective layer and the conductive enhancement layer. On the one hand, the patterning of the first electrode material layer and the patterning of the conductive enhancement material layer and the protective material layer can be completed through a single mask, which reduces the production cost and improves the production line capacity; on the other hand, when the ashing is performed on the mask pattern, there is the protective material layer to protect the conductive enhancement material layer to avoid oxidation and corrosion of the conductive enhancement material layer during the ashing process, so as to avoid etching the first electrode when the first electrode material layer is patterned to form the first electrode, resulting in disconnection of the first electrode; in addition, the conductive enhancement material layer can effectively reduce the resistance of the first electrode and improve the uniformity of the first electrode, thereby effectively improving the display color cast.

It should be noted that the above general description and the following detailed description are merely exemplary and explanatory and should not be construed as limiting of the disclosure.

BRIEF DESCRIPTION OF THE DRAWINGS

The drawings here are incorporated into the specification and constitute a part of the specification, show embodiments in consistent with the present disclosure, and are used together with the specification to explain principles of the present disclosure. Obviously, the drawings in the following description are only some embodiments of the present disclosure. For those of ordinary skill in the art, other drawings can be obtained based on these drawings without creative work.

FIG. 1 is a schematic block diagram of a flow of an embodiment of a manufacturing method for an array substrate of the present disclosure.

FIGS. 2-14 are schematic structural diagrams of various steps in a manufacturing method for an array substrate of the present disclosure.

FIG. 16 is a schematic top structural diagram of an array substrate shown in FIG. 15.

FIG. 17 is a schematic block diagram of a flow of an embodiment of a manufacturing method for a display panel of the present disclosure.

FIG. 18 is a schematic structural diagram of an embodiment of a display panel of the present disclosure.

DESCRIPTION OF REFERENCE SIGNS

Figure 5:
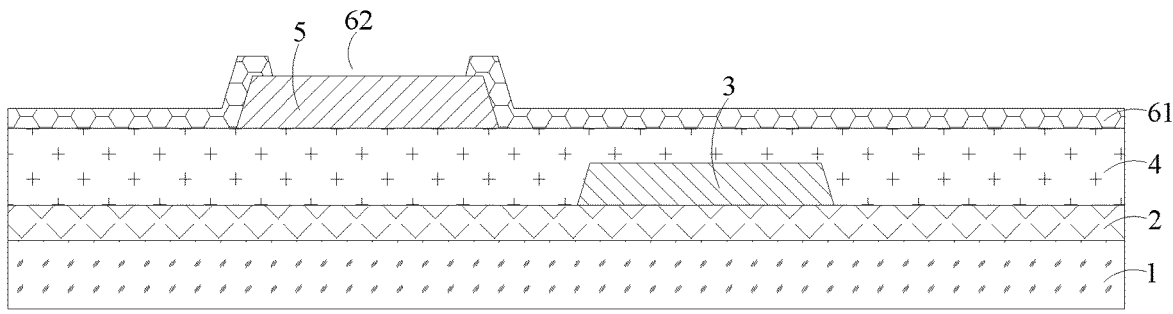

1. Base substrate; 2. Buffer layer; 3. Gate line; 31. Gate; 4. Gate insulating layer; 5. Data line; 51. Source; 61, First insulating layer; 62, First via hole; 71. Organic insulating layer; 72. Second via hole; 81, First electrode material layer; 811, First electrode; 812, Third via hole; 82, Conductive enhancement material layer; 821, Conductive enhancement layer; 83, Protective material layer; 831, Protective layer; 8311, Second straight line portion; 8312, Second curved portion;
91, Mask layer; 92, Mask pattern; 921, First portion; 922, Second portion;
10. Mask plate; 101. Light-transmitting portion; 102. Light-shielding portion; 103. Semi-light-transmitting portion;
111, Second insulating layer; 112, Fourth via hole;
12. Second electrode;
13, Color filter substrate; 131, Base layer; 132, Black matrix; 133, Filter portion;
141, First spacer; 142, Second spacer;
15. Array substrate; 16. Active layer.

DETAILED DESCRIPTION

Embodiments will now be described more fully with reference to the drawings. However, the embodiments can be implemented in a variety of forms and should not be construed as being limited to embodiments set forth herein; rather, these embodiments are provided so that the present disclosure will be more full and complete so as to convey the idea of the embodiments to those skilled in this art. The same reference signs in the drawings denote the same or similar structures, and the detailed description thereof will be omitted. In addition, the drawings are merely schematic representations of the present disclosure and are not necessarily drawn to scale.

Although relative terms such as "above" and "below" are used in the specification to describe a relative relationship of one component to another component shown, these terms are only for convenience in this specification, for example, according to an exemplary direction shown in the drawings. It can be understood that if a device shown is flipped upside down, the component described as "above" will become a component "below" another component. When a structure is "on" another structure, it may mean that the structure is integrally formed on another structure, or that the structure is "directly" disposed on another structure, or that the structure is "indirectly" disposed on another structure through other structures.

The terms "one", "a", "the", "said", and "at least one" are used to indicate that there are one or more elements/components or the like; the terms "include" and "have" are used to indicate an open meaning of including and means that there may be additional elements/components/etc. in addition to the listed elements/components/etc.; and the terms "first", "second" and "third" etc. are used only as markers, and do not limit the number of objects.

Embodiments of the present disclosure provide a manufacturing method for an array substrate. Referring to FIG. 1, the manufacturing method for the array substrate may include the following steps S10 to S50.

In the step S10, a first electrode material layer, a conductive enhancement material layer and a protective material layer are formed in sequence, and oxidation resistance of the protective material layer is stronger than oxidation resistance of the conductive enhancement material layer.

In the step S20, a mask pattern is formed on a side of the protective material layer away from the first electrode material layer, the mask pattern includes a first portion and a second portion, and a thickness of the first portion is greater than a thickness of the second portion.

In the step S30, ashing is performed on the mask pattern to remove the second portion to expose the protective material layer covered by the second portion.

In the step S40, the first electrode material layer is patterned to form a first electrode.

In the step S50, the protective material layer and the conductive enhancement material layer are patterned to form a protective layer and a conductive enhancement layer.

In the manufacturing method for the array substrate of the present disclosure, on the one hand, the patterning of the first electrode material layer 81 and the patterning of the conductive enhancement material layer 82 and the protective material layer can be completed through a single mask, which reduces the production cost and improves the production line capacity; on the other hand, when the ashing is performed on the mask pattern 92, there is the protective material layer 83 to protect the conductive enhancement material layer 82 to avoid oxidation and corrosion of the conductive enhancement material layer 82 during the ashing process, so as to avoid etching the first electrode 811 when the first electrode material layer 81 is patterned to form the first electrode 811, resulting in a disconnection of the first electrode 811; in addition, the conductive enhancement material layer 82 can effectively reduce the resistance of the first electrode 811 and improve the uniformity of the first electrode 811, thereby effectively improving the color cast of the display.

Each step of the manufacturing method for the array substrate will be described in detail below.

In the step S10, the first electrode material layer 81, the conductive enhancement material layer 82 and the protective material layer 83 are formed in sequence, and the oxidation resistance of the protective material layer 83 is stronger than the oxidation resistance of the conductive enhancement material layer 82.

In the embodiments of the present disclosure, a base substrate 1 is provided, and the base substrate 1 may be a rigid substrate, for example, a glass substrate.

In the embodiments of the present disclosure, as shown in FIGS. 2 and 16, a buffer layer 2 may be formed on a side of the base substrate 1. A gate material layer is formed by sputtering a metal coating on a side of the buffer layer 2 away from the base substrate 1, and photolithography is performed on the gate material layer to form a gate pattern. The gate pattern may include a gate 31 and a gate line 3, and the gate 31 is coupled with the gate line 3.

Referring to FIGS. 3 and 16, a gate insulating layer 4 is formed on the gate pattern and the exposed side of the buffer layer 2 away from the base substrate 1 in a deposition manner through Plasma Enhanced Chemical Vapor Deposition (PECVD).

An active material layer may be formed on a side of the gate insulating layer 4 away from the base substrate 1 in the deposition manner through PECVD, and the photolithography is performed on the active material layer to form an active layer 16.

Referring to FIG. 4, a source-drain material layer may be formed in the deposition manner by sputtering the metal coating on the active layer 16 and the exposed side of the gate insulating layer 4 away from the base substrate 1, and the photolithography is performed on the source-drain material layer to form a source-drain pattern. The source-drain pattern may include a data line 5, a source and a drain (not shown in the figure), the source and the drain are both coupled to the active layer 16, and the data line 5 is coupled to the source or the drain. In a case where a thin film transistor having an opposite polarity is used or in a case where a current direction during a circuit operation changes, functions of the "source" and "drain" may be interchanged with each other sometimes. Therefore, in this specification, the "source" and "drain" may be interchanged with each other.

So far, the manufacturing of the thin film transistor is completed.

It should be noted that the thin film transistor described above is a bottom gate thin film transistor. In other embodiments of the present disclosure, the thin film transistor may also be a top gate thin film transistor or a double gate thin film transistor, and the manufacturing method thereof is not described in detail here.

Referring to FIG. 5, a first insulating layer 61 may be formed on a side of the source-drain pattern away from the base substrate 1 in the deposition manner through PECVD, and the photolithography is performed on the first insulating layer 61 to form a first via hole 62 in the first insulating layer 61. The first via hole 62 is in communication with the data line 5, that is, the data line 5 at the first via hole 62 is exposed.

Figure 6:
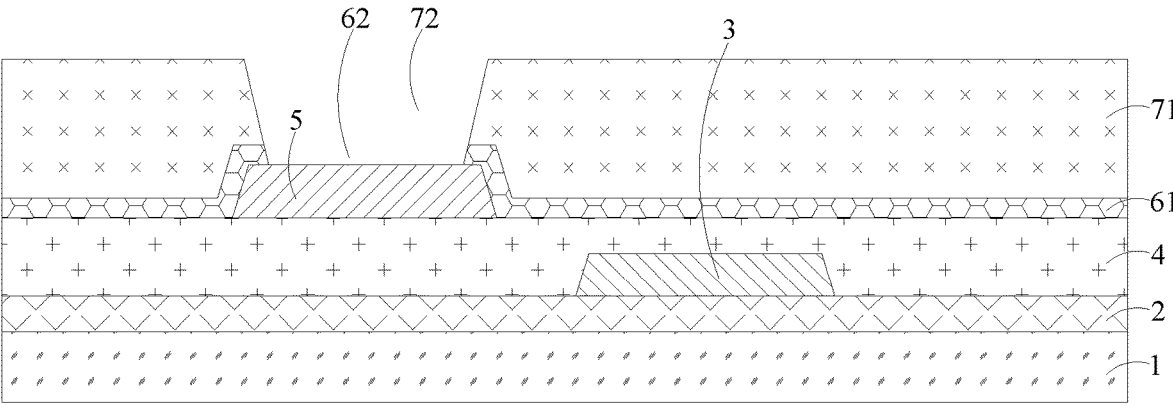

Referring to FIG. 6, an organic insulating layer 71 may be formed on a side of the first insulating layer 61 away from the base substrate 1 in the deposition manner through PECVD, and the photolithography is performed on the organic insulating layer 71 to form a second via hole 72 in the organic insulating layer 71. The second via hole 72 is in communication with the first via hole 62, that is, the data line 5 at the second via hole 72 is exposed. A material of the organic insulating layer 71 may be Photo Active Compound (PAC), and a thickness of the organic insulating layer 71 is greater than or equal to 2 µm and less than or equal to 3 µm, for example, the thickness of the organic insulating layer 71 may be 2.4 µm.

The organic insulating layer 71 can play a role of planarization, providing a relatively flat base for the first electrode 811 to be formed subsequently, thereby facilitating the formation of the first electrode 811, and improving the uniformity of the first electrode 811. In addition, the organic insulating layer 71 causes a distance between the first electrode 811 and the data line 5 in a thickness direction to be increased, weakening a mutual influence between the first electrode 811 and the data line 5 and greatly reducing the parasitic capacitance, which is more conducive to the driving of a driving chip. In the case that the thickness between the first electrode 811 and the data line 5 in the thickness direction increases, distances between the first electrode 811 and the data line 5 in other directions (for example, in a direction parallel to the base substrate 1) can be shortened, so that a width of a black matrix 132 of a color filter substrate 13 can also be manufactured smaller, thereby increasing an aperture ratio of the product.

Figure 7:
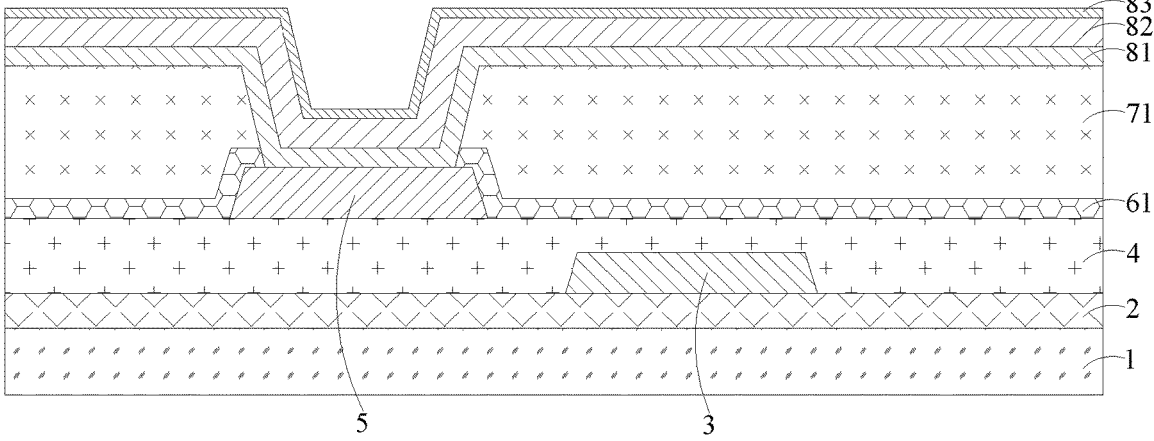

Referring to FIG. 7, the first electrode material layer 81 may be formed by sputtering the metal coating on a side of the organic insulating layer 71 away from the base substrate 1. A material of the first electrode material layer 81 may be ITO, and a thickness of the first electrode material layer 81 is greater than or equal to 400 A and less than or equal to 700 A, for example, the thickness of the first electrode material layer 81 may be 550 A. Note that, the material of the first electrode material layer 81 may also be another conductive material.

The conductive enhancement material layer 82 may be formed by sputtering the metal coating on a side of the first electrode material layer 81 away from the base substrate 1. A material of the conductive enhancement material layer 82 may be copper, and a thickness of the conductive enhancement material layer 82 is greater than or equal to 1000 A and less than or equal to 1500 A, for example, the thickness of the conductive enhancement material layer 82 may be 1200 A. Note that, in other embodiments of the present disclosure, the material of the conductive enhancement material layer 82 may also be another metal material such as aluminum and silver.

The protective material layer 83 can be formed by sputtering the metal coating on a side of the conductive enhancement material layer 82 away from the base substrate 1. A material of the protective material layer 83 can be MoNbTi, and a thickness of the protective material layer 83 is greater than or equal to 300 A and less than or equal to 500 A, for example, the thickness of the protective material layer 83 may be 400 A. Note that, in other embodiments of the present disclosure, the material of the protective material layer 83 may also be another titanium alloy, as long as the oxidation resistance of the protective material layer 83 is stronger than that of the conductive enhancement material layer 82. The oxidation resistance refers to an ability of a metal material to resist a corrosion effect of oxidative atmosphere at a high temperature. A material with the weak oxidation resistance (such as MoNb) reacts with an ashing gas to affect a plasma balance, causing an arcing alarm. Therefore, a material with the strong oxidation resistance is employed.

The thickness of the first electrode material layer 81, the thickness of the conductive enhancement material layer 82 and the thickness of the protective material layer 83 mentioned above are all data obtained by the inventor through numerous experiments, and accordingly, the uniformity of film formation is good, the conductive effect is good, and the efficiency is high, since a too thick thickness is not conducive to the lightening and thinning of the display panel, and the film formation time is long and the efficiency is low; and a too thin thickness causes poor uniformity and is prone to disconnection.

In the step S20, the mask pattern 92 is formed on the side of the protective material layer 83 away from the first electrode material layer 81, the mask pattern 92 includes the first portion 921 and the second portion 922, and the thickness of the first portion 921 is greater than the thickness of the second portion 922.

Figure 8:
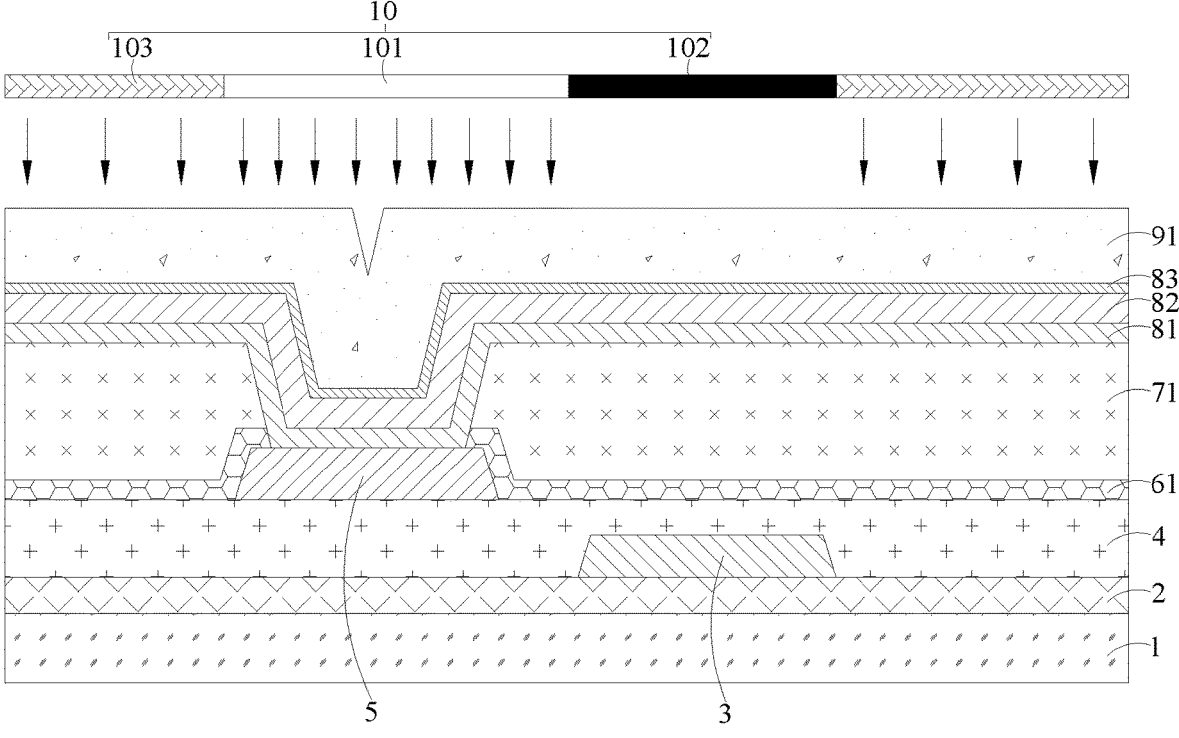

In the embodiments of the present disclosure, referring to FIG. 8, arrows in the figure represent irradiated light. The denser the arrows are, the more the transmitted light are, and on the contrary, the sparser the arrows are, the less the transmitted light are. A mask layer 91 can be formed on the side of the protective material layer 83 away from the base substrate 1 in the deposition manner through PECVD, and a half-mask process is performed on the mask layer 91 to form the mask pattern 92. The mask pattern 92 can include the first portion 921 and the second portion 922, and the thickness of the first portion 921 is greater than the thickness of the second portion 922.

Specifically, a mask plate 10 is placed on a side of the mask layer 91 away from the base substrate 1, and the mask plate 10 may include a light-transmitting portion 101, a light-shielding portion 102 and a semi-light-transmitting portion 103. The semi-light-transmitting portion 103 is disposed opposite to the second portion 922, that is, an orthographic projection of the semi-light-transmitting portion 103 on the base substrate 1 coincides with an orthographic projection of the second portion 922 on the base substrate 1. The light-shielding portion 102 is disposed opposite to the first portion 921, that is, an orthographic projection of the light-shielding portion 102 on the base substrate 1 coincides with an orthographic projection of the first portion 921 on the base substrate 1. The light-transmitting portion 101 is disposed opposite to other portions of the mask layer 91.

Figure 9:
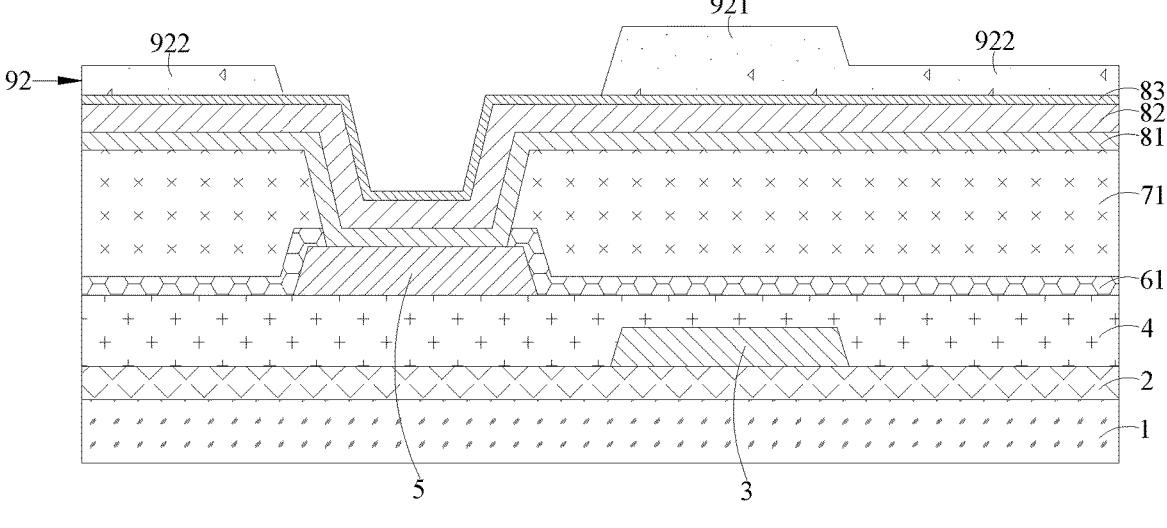

Then, as shown in FIG. 9, the mask layer 91 is exposed and developed to remove the mask layer 91 disposed opposite to the light-transmitting portion 101, so that a part of the protective material layer 83 is exposed. A certain thickness of the mask layer 91 disposed opposite to the semi-light-transmitting portion 103 is removed to form the second portion 922. The mask layer 91 disposed opposite to the light-shielding portion 102 is completely retained to form the first portion 921, so that the thickness of the first portion 921 is greater than that of the second portion 922.

Figure 10:
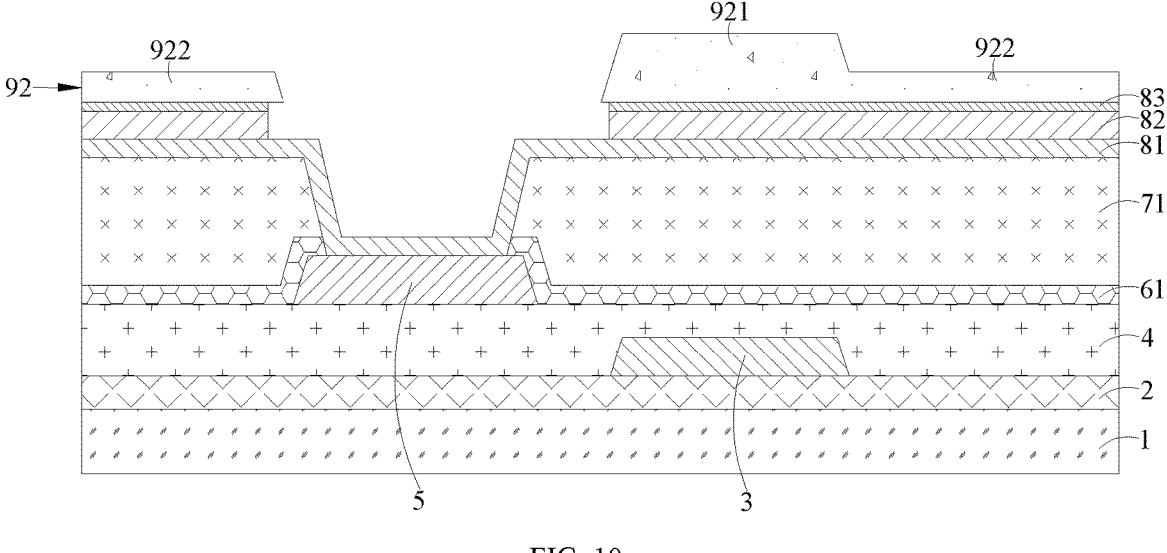

Finally, referring to FIG. 10, a first etching is performed on the exposed protective material layer 83 and the conductive enhancement material layer 82 corresponding to the exposed protective material layer 83, and the protective material layer 83 and the conductive enhancement material layer 82 covered by the mask pattern 92 are retained.

In the step S30, the ashing is performed on the mask pattern 92 to remove the second portion 922 to expose the protective material layer 83 covered by the second portion 922.

Figure 11:
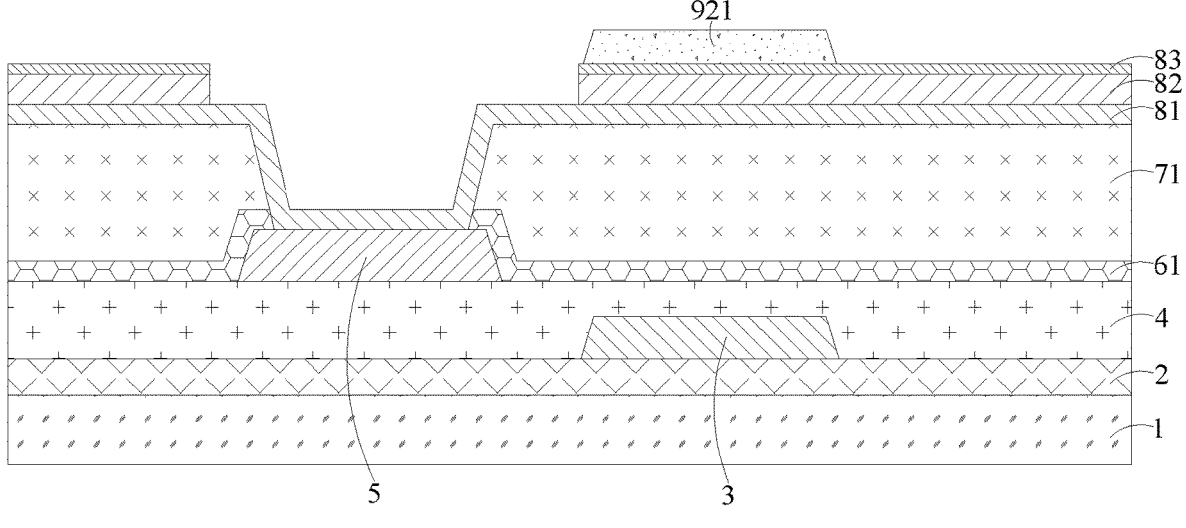

In the embodiments of the present disclosure, referring to FIG. 11, an ashing process is performed on the mask pattern 92. A gas used in the ashing process may include SF6 and O2, and the gas used in the ashing process has a strong oxidability. Since the oxidation resistance of the protective material layer 83 is stronger than that of the conductive enhancement material layer 82, and the protective material layer 83 covers the conductive enhancement material layer 82, the protective material layer 83 can protect the conductive enhancement material layer 82 to prevent the oxidizing gas from oxidizing and corroding the conductive enhancement material layer 82 during the ashing process for the mask pattern 92, thereby avoiding creating the disconnection on the conductive enhancement material layer 82.

The second portion 922 is removed by the ashing process, so that the protective material layer 83 covered by the second portion 922 is exposed, and the thickness of the first portion 921 is also reduced.

In the step S40, the first electrode material layer 81 is patterned to form the first electrode 811.

Figure 12:
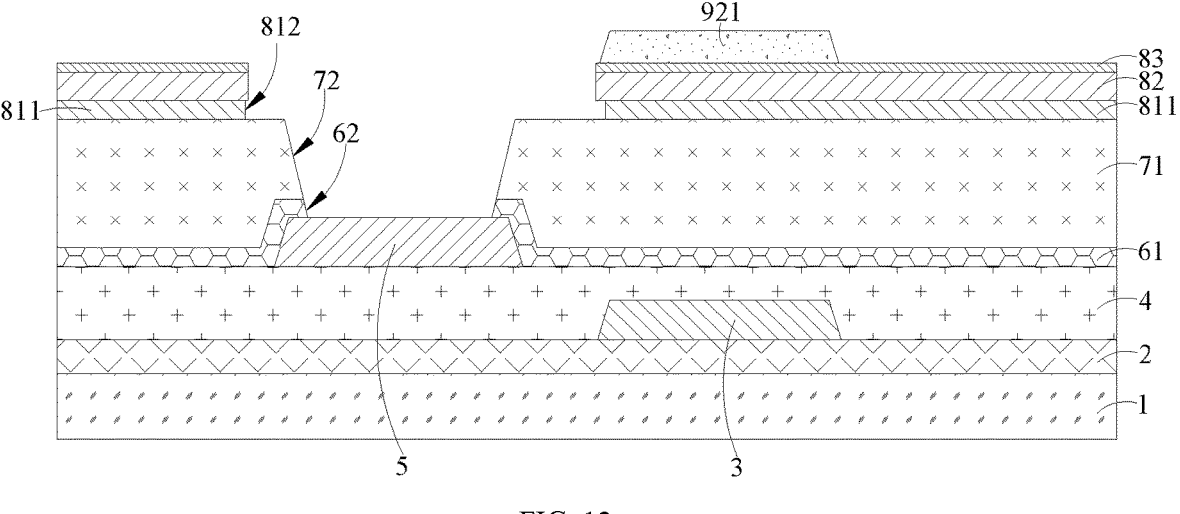

In the embodiments of the present disclosure, referring to FIG. 12, the first electrode material layer 81 is etched by using the first portion 921, the protective material layer 83 and the conductive enhancement material layer 82 as the mask to form the first electrode 811, and a third via hole 812 is formed in the first electrode 811, and is in communication with the second via hole 72, that is, the data line 5 at the third via hole 812 is exposed. Since there is no disconnection on the conductive enhancement material layer 82, the first electrode material layer 81 covered by the protective material layer 83 and the conductive enhancement material layer 82 will not be etched in the process of etching the first electrode material layer 81, so as to avoid creating the disconnection on the first electrode 811.

The first electrode 811 may be a common electrode.

In the step S50, the protective material layer 83 and the conductive enhancement material layer 82 are patterned to form the protective layer 831 and the conductive enhancement layer 821.

Figure 13:
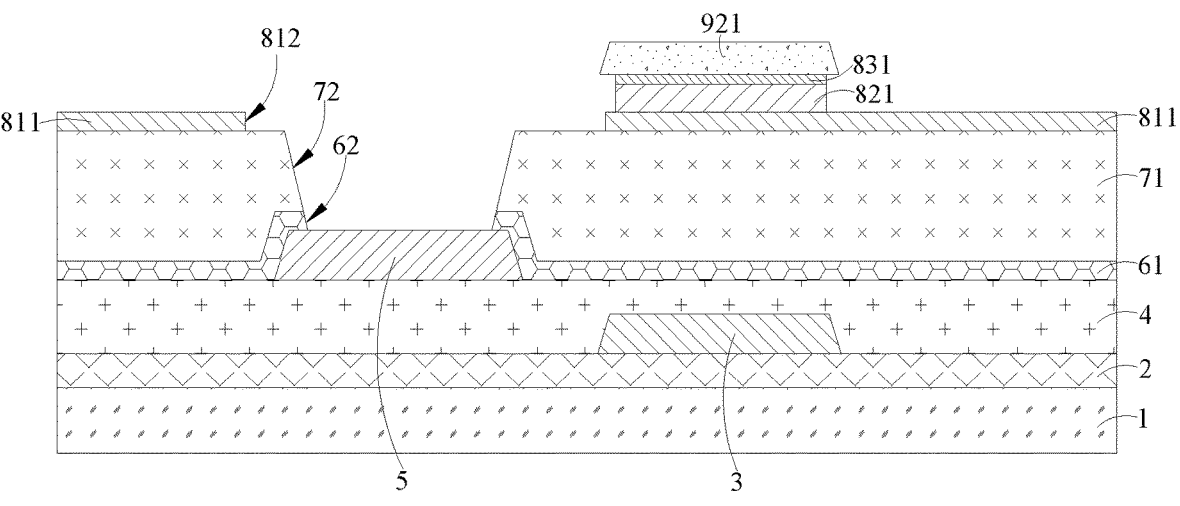

In the embodiments of the present disclosure, referring to FIG. 13, the protective material layer 83 and the conductive enhancement material layer 82 are etched by using the first portion 921 as the mask to form the protective layer 831 and the conductive enhancement layer 821. An orthographic projection of the conductive enhancement layer 821 on the base substrate 1 is substantially coincident with an orthographic projection of the protective layer 831 on the base substrate 1. There is an overlapping between the orthographic projection of the conductive enhancement layer 821 on the base substrate 1 and an orthographic projection of the gate line 3 on the base substrate 1. Specifically, the orthographic projection of the conductive enhancement layer 821 on the base substrate 1 is located within the orthographic projection of the gate line 3 on the base substrate 1, that is, an extension direction of the protective layer 831 and the conductive enhancement layer 821 is consistent with an extension direction of the gate line 3, and widths of the protective layer 831 and the conductive enhancement layer 821 are slightly smaller than a width of the gate line 3. The width of the conductive enhancement layer 821 is about 3.5 μm, the width of the protective layer 831 is also about 3.5 μm, and the width of the gate line 3 is about 4.5 μm. Since both the protective layer 831 and the conductive enhancement layer 821 are made of metal materials, they are opaque and reflective. Therefore, in order to prevent their reflection from affecting the display effect, the protective layer 831 and the conductive enhancement layer 821 need to be blocked by the black matrix 132, and the gate line 3 is also blocked by the black matrix 132. The orthographic projection of the conductive enhancement layer 821 on the base substrate 1 is located within the orthographic projection of the gate line 3 on the base substrate 1, which can avoid increasing a width of the black matrix 132, thereby avoiding reducing an aperture ratio.

In other embodiments of the present disclosure, the protective layer 831 and the conductive enhancement layer 821 can be disposed on a side close to the data line 5, but since the data line 5 needs to be coupled to a pixel electrode through a via hole, the orthographic projection of the conductive e enhancement layer 821 on the base substrate 1 still needs to overlap with the orthographic projection of the gate line 3 on the base substrate 1.

The conductive enhancement layer 821 is disposed on a side of the first electrode 811 away from the base substrate 1 and is coupled with the first electrode 811. The conductive enhancement layer 821 can reduce the resistance of the first electrode 811, thereby increasing the conductive effect of the first electrode 811. Moreover, the conductive enhancement layer 821 can improve the uniformity of the first electrode 811 and effectively improve the display color cast. The material of the protective layer 831 is also a metal, which is a conductive material, and accordingly, the protective layer 831 can further reduce the resistance of the first electrode 811, thereby further increasing the conductive effect of the first electrode 811, also improving the uniformity of the first electrode 811, and effectively improve the display color cast.

Finally, the remaining mask pattern 92 is removed.

It should be noted that although a structure of combining the organic insulating film layer and the conductive enhancement layer 821 has many of the above-mentioned beneficial effects, if the organic insulating film layer and the conductive enhancement layer 821 are formed by two mask processes, it will lead to increased cost and reduced production capacity. In order to reduce the number of mask processes, the organic insulating film layer and the conductive enhancement layer 821 need to be manufactured through one mask process. However, since the ashing process has an etching effect on the organic insulating layer 71, it is necessary to first perform the ashing process and then pattern the first electrode material layer 81. When the ashing process is performed on the mask pattern 92, the first electrode material layer 81 has a protective effect on the organic insulating layer 71 to avoid etching the organic insulating layer 71 by the ashing process. However, the ashing process also has an oxidation and corrosion effect on the conductive enhancement material layer 82. In the present disclosure, the conductive enhancement material layer 82 is protected by the protective material layer 83 with the strong oxidation resistance, avoiding the oxidation and corrosion of the conductive enhancement material layer 82 during the ashing process, so as to avoid creating the disconnection on the first electrode 811 layer covered by the conductive enhancement material layer 82.

Figure 14:
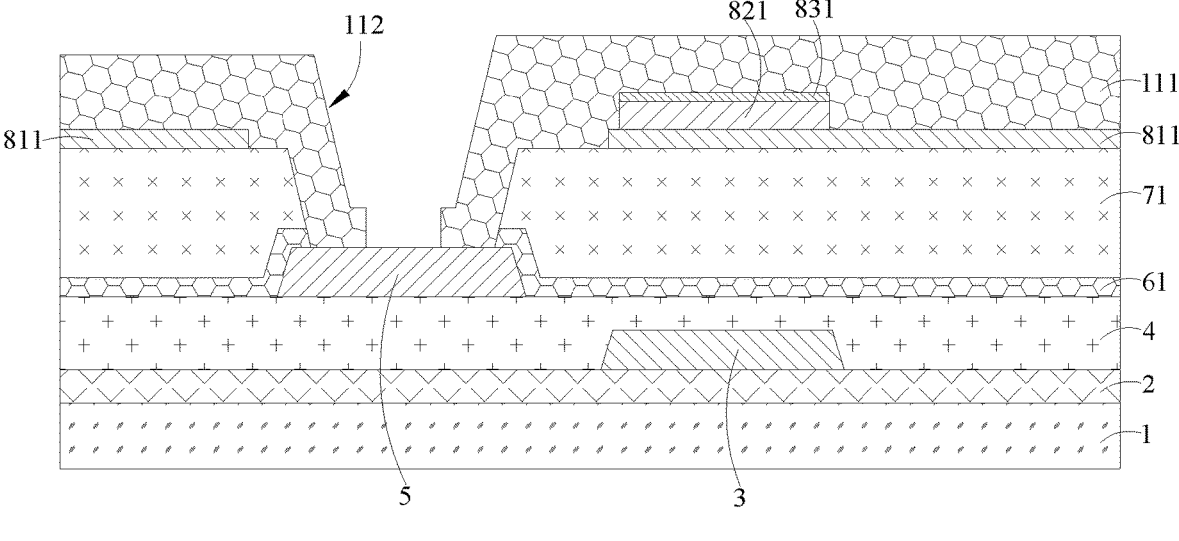

In the embodiments of the present disclosure, referring to FIG. 14, first, a second insulating layer 111 is formed on sides of the protective layer 831 and the first electrode 811 away from the base substrate 1, and a photoresist is formed on a side of the second insulating layer 111 away from the base substrate 1 to expose and develop the photoresist to form a photoresist pattern; then, the second insulating layer 111 is etched by using the photoresist pattern as the mask, so that a fourth via hole 112 is formed in the second insulating layer 111, and the fourth via hole 112 is in communication with the third via hole 812, that is, the data line 5 at the fourth via hole 112 is exposed; finally, the photoresist pattern is removed.

Figure 15:
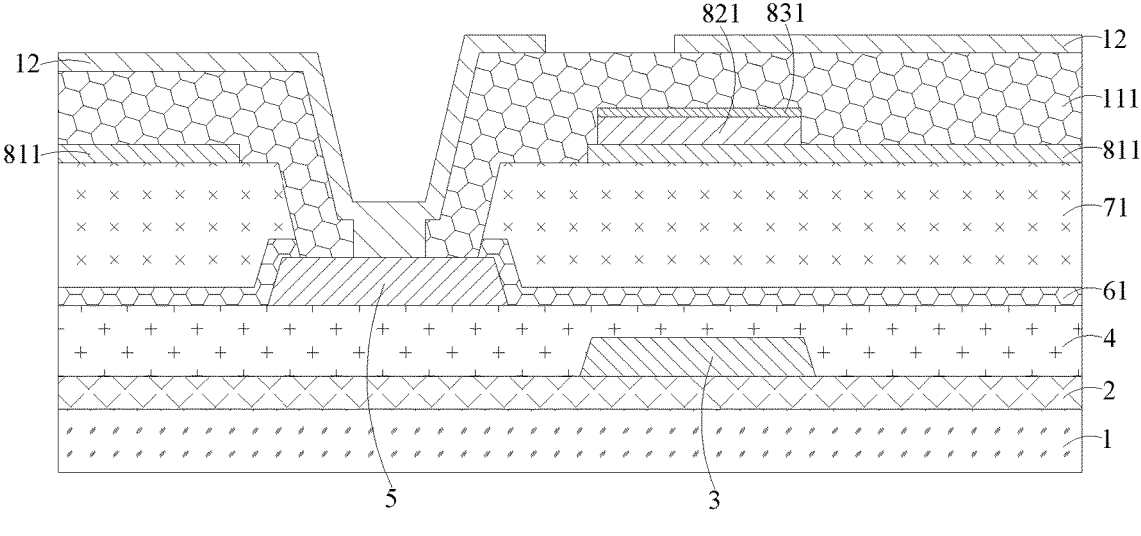
FIG. 15 is a schematic structural diagram of an embodiment of an array substrate of the present disclosure.
Figure 19:
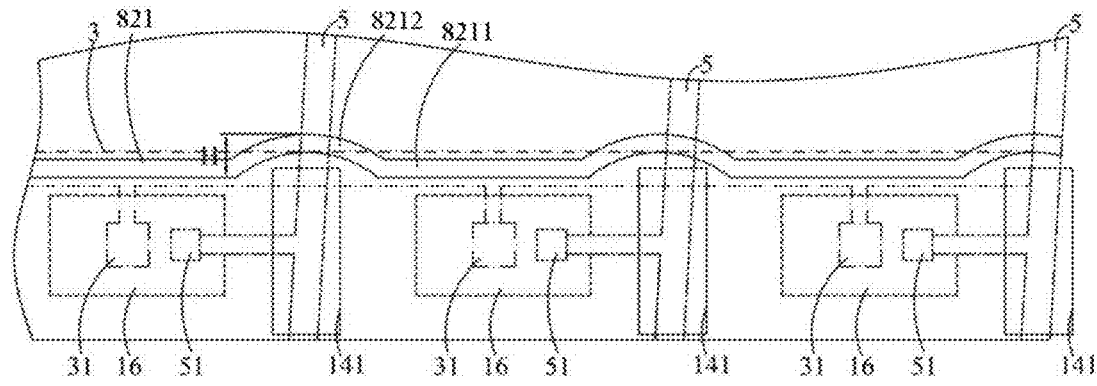
FIG. 19 is a schematic top structural diagram of an array substrate.

In the embodiments of the present disclosure, referring to FIG. 15, a second electrode material layer is formed on the side of the second insulating layer 111 away from the base substrate 1, and a material of the second electrode material layer may be ITO. Then, the photolithography is performed on the second electrode material layer to form a second 20) electrode 12. The second electrode 12 is coupled to the data line 5 through the fourth via hole 112, the third via hole 812, the second via hole 72 and the first via hole 62, and the second electrode 12 may also be coupled to the source or the drain. The second electrode 12 may be the pixel electrode.

In addition, in other embodiments of the present disclosure, after the organic insulating layer 71 is formed, the second electrode 12 may be formed on the side of the organic insulating layer 71 away from the base substrate 1, and the second electrode 12 may be the pixel electrode. The second electrode 12 is coupled to the data line 5 through the first via hole 62 in the first insulating layer 61 and the second via hole 72 in the organic insulating layer 71. The second insulating layer 111 is formed on a side of the second electrode 12 away from the base substrate 1, and the first electrode material layer 81, the conductive enhancement material layer 82 and the protective material layer 83 are formed in sequence on the side of the second insulating layer 111 away from the base substrate 1. Then, the first electrode material layer 81, the conductive enhancement material layer 82 and the protective material layer 83 are etched by the etching method described above, and the specific etching method has been described in detail above, which will not repeated here.

The above specifically describes that each film layer can be formed by sputtering the metal coating or formed in the deposition manner through PECVD. These descriptions are only examples and do not constitute a limitation on the present disclosure. In other embodiments of the present disclosure, each film layer can also be formed by using other methods such as coating, printing, and other chemical vapor deposition methods, which belongs to the scope of protection of the present disclosure.

It should be noted that although various steps of the manufacturing method for the array substrate in the present disclosure are described in a particular order in the drawings, this is not required or implied that these steps must be performed in the particular order or all the steps shown must be performed to achieve a desired result. Additionally or alternatively, certain steps may be omitted, multiple steps may be combined into one step, and/or one step may be decomposed into multiple steps and so on.

Based on the same inventive concept, the embodiments of the present disclosure further provide an array substrate. As shown in FIG. 15, the array substrate can be manufactured by the manufacturing method for the array substrate described in any one of the above embodiments. The array substrate can include the first electrode 811, the conductive enhancement layer 821 and the protective layer 831. The conductive enhancement layer 821 is disposed on a side of the first electrode 811, and the protective layer 831 is disposed on the side of the conductive enhancement layer 821 away from the first electrode 811. The oxidation resistance of the protective layer 831 is stronger than that of the conductive enhancement layer 821.

In the embodiments of the present disclosure, the array substrate may further include the base substrate 1, and the base substrate 1 may be the rigid substrate, for example, the glass substrate.

The buffer layer 2 is disposed on the side of the base substrate 1.

The gate pattern is disposed on the side of the buffer layer 2 away from the base substrate 1, and the gate pattern may include the gate 31 and the gate line 3.

The gate insulating layer 4 is disposed on the side of the gate pattern away from the base substrate 1. The active layer 16 is disposed on the side of the gate insulating layer 4 away from the base substrate 1, and the source-drain pattern is disposed on the side of the active layer 16 away from the base substrate 1. The source-drain pattern may include the data line 5, the source and the drain, and both the source and the drain are coupled to the active layer 16, the data line 5 is coupled to the source or the drain.

It should be noted that the gate 31, the active layer 16, the source and the drain form a thin film transistor, and a plurality of thin film transistors are arranged on the side of the base substrate 1 in an array. The thin film transistor described above is the bottom gate thin film transistor. In other embodiments of the present disclosure, the thin film transistor may also be the top gate thin film transistor or the double gate thin film transistor, which is not described in detail here.

The first insulating layer 61 is disposed on the side of the source-drain pattern away from the base substrate 1, the first via hole 62 is disposed in the first insulating layer 61, and the first via hole 62 is in communication with the data line 5.

The organic insulating layer 71 is disposed on the side of the first insulating layer 61 away from the base substrate 1, and the second via hole 72 is disposed in the organic insulating layer 71. The second via hole 72 is in communication with the first via hole 62, that is, the second via hole 72 is also in communication with the data line 5.

The first electrode 811 is disposed on the side of the organic insulating layer 71 away from the base substrate 1, and the third via hole 812 is disposed in the first electrode 811. The third via hole 812 is in communication with the second via hole 72, that is, the third via hole 812 is also in communication with the data line 5. The first electrode 811 may be the common electrode.

The conductive enhancement layer 821 is disposed on the side of the first electrode 811 away from the base substrate 1, and there is the overlapping between the orthographic projection of the conductive enhancement layer 821 on the base substrate 1 and the orthographic projection of the gate line 3 on the base substrate 1.

The protective layer 831 is disposed on the side of the conductive enhancement layer 821 away from the base substrate 1, and the orthographic projection of the protective layer 831 on the base substrate 1 is substantially coincident with the orthographic projection of the conductive enhancement layer 821 on the base substrate 1, so that there is also the overlapping between the orthographic projection of the protective layer 831 on the base substrate 1 and the orthographic projection of the gate line 3 on the base substrate 1. Due to process reasons, the orthographic projection of the protective layer 831 on the base substrate 1 is located within the orthographic projection of the conductive enhancement layer 821 on the base substrate 1, that is, the protective layer 831 is slightly smaller than the conductive enhancement layer 821.

The material of the first electrode 811 can be ITO, the thickness of the first electrode 811 is greater than or equal to 400 A and less than or equal to 700 A, for example, the thickness of the first electrode 811 can be 550 A. Note that, the material of the first electrode 811 may also be another conductive material.

The material of the conductive enhancement layer 821 may be copper, and the thickness of the conductive enhancement layer 821 may be greater than or equal to 1000 A and less than or equal to 1500 A, for example, the thickness of the conductive enhancement layer 821 may be 1200 A. Note that, in other embodiments of the present disclosure, the material of the conductive enhancement layer 821 may also be another metal material such as aluminum and silver.

The material of the protective layer 831 can be MoNbTi, and the thickness of the protective layer 831 is greater than or equal to 300 A and less than or equal to 500 A, for example, the thickness of the protective layer 831 can be 400 A. Note that, in other embodiments of the present disclosure, the material of the protective layer 831 may also be another titanium alloy, for example, the material of the protective layer 831 may be a titanium alloy including three metal materials, or a titanium alloy including four metal materials, which has the strong oxidation resistance, as long as the oxidation resistance of the protective layer 831 is stronger than that of the conductive enhancement layer 821.

In the embodiments of the present disclosure, there are disposed a plurality of strips of conductive enhancement layers 821, and the plurality of strips of conductive enhancement layers 821 are arranged in parallel with each other. There may be a one-to-one correspondence between the conductive enhancement layer 821 and the gate line 3, that is, one conductive enhancement layer 821 is disposed on a side of one gate line 3 away from the base substrate 1. There are also disposed a plurality of strips of protective layers 831, and the plurality of strips of protective layers 831 are also arranged in parallel with each other. Please note that, in this case, there is also a one-to-one correspondence between the protective layer 831 and the gate line 3, that is, one protective layer 831 is disposed on the side of one gate line 3 away from the base substrate 1.

The plurality of gate lines 3 are substantially uniformly arranged on the array substrate, and the plurality of conductive enhancement layers 821 and the plurality of protective layers 831 correspond to the plurality of gate lines 3 one-to-one, so that the plurality of conductive enhancement layers 821 and the plurality of protective layers 831 are also uniformly arranged on the array substrate, so that the resistance of the first electrode 811 is more uniform, which effectively improves the display color cast.

Referring to a schematic top structural diagram of the array substrate shown in FIG. 16, the extension direction of the conductive enhancement layer 821 is consistent with the extension direction of the gate line 3, and the orthographic projection of the conductive enhancement layer 821 on the base substrate 1 is at least partially located within the orthographic projection of the gate line 3 on the base substrate 1. The extension direction of the protective layer 831 is consistent with the extension direction of the gate line 3, and the orthographic projection of the protective layer 831 on the base substrate 1 is at least partially within the orthographic projection of the gate line 3 on the base substrate 1.

The array substrate may further include a first spacer 141, and the first spacer 141 is disposed on the side of the first electrode 811 away from the base substrate 1. Specifically, the first spacer 141 is disposed on the side of the second electrode 12 away from the base substrate 1.

The first spacer 141 may be disposed as a quadrangular pyramid structure, that is, a cross section of the first spacer 141 parallel to the base substrate 1 is a rectangle, and an area of a bottom surface of the first spacer 141 close to the base substrate 1 is larger than an area of a top surface of the first spacer 141 away from the base substrate 1. A length of the bottom surface of the first spacer 141 is greater than or equal to 19.6 μm and less than or equal to 21.6 μm, for example, the length of the bottom surface of the first spacer 141 may be 20.6 μm. A width of the bottom surface of the first spacer 141 is greater than or equal to 16 μm and less than or equal to 18 μm, for example, the width of the bottom surface of the first spacer 141 may be 17 μm. A height of the first spacer 141 is greater than or equal to 19.6 μm and less than or equal to 21.6 μm, for example, the height of the first spacer 141 may be 20.6 μm.

The first spacer 141 can be generally disposed on a relatively flat plane between two adjacent thin film transistors, and thus the first spacer 141 is located between two adjacent thin film transistors. A length direction of the first spacer 141 is consistent with an extension direction of the data line 5, and there is an overlapping between an orthographic projection of the first spacer 141 on the base substrate 1 and an orthographic projection of the data line 5 on the base substrate 1, that is, the first spacer 141 is disposed opposite to the data line 5.

The orthographic projection of the conductive enhancement layer 821 on the base substrate 1 is set as a curve, the conductive enhancement layer 821 is recessed and bent to the side away from the first spacer 141 at a position adjacent to the first spacer 141, and a depth H of the recessing and bending is greater than or equal to 2 μm and less than or equal to 3 μm, for example, the depth H of the recessing and bending can be 2.5 μm. The orthographic projection of the protective layer 831 on the base substrate 1 is set as a curve, and the protective layer 831 is recessed and bent to the side away from the first spacer 141 at a position adjacent to the first spacer 141, and a depth H of the recessing and bending is greater than or equal to 2 μm and less than or equal to 3 μm, for example, the depth H of the recessing and bending can be 2.5 μm. Moreover, positions where the conductive enhancement layer 821 and the protective layer 831 are recessed and bent are generally positions where they intersect with the data line 5.

Specifically, the conductive enhancement layer 821 may include a first straight portion and a first curved portion (because they are blocked by a second straight portion 8311 and a second curved portion 8312, they not shown in the figure). An orthographic projection of the first straight portion on the base substrate 1 is located within the orthographic projection of the gate line 3 on the base substrate 1, and an orthographic projection of the first curved portion on the base substrate 1 is at least partially not overlapped with the orthographic projection of the gate line 3 on the base substrate 1, that is, an orthographic projection of two ends of the first curved portion coupled to the first straight portions on the base substrate 1 is located within the orthographic projection of the gate line 3 on the base substrate 1, but an orthographic projection of a middle portion of the first curved portion on the base substrate 1 is not overlapped with the orthographic projection of the gate line 3 on the base substrate 1. The protective layer 831 may include the second straight portion 8311 and the second curved portion 8312, an orthographic projection of the second straight portion 8311 on the base substrate 1 is located within the orthographic projection of the gate line 3 on the base substrate 1, and an orthographic projection of the second curved portion 8312 on the base substrate 1 is at least partially not overlapped with the orthographic projection of the gate line 3 on the base substrate 1, that is, an orthographic projection of two ends of the second curved portion 8312 coupled to the second straight portions 8311 on the base substrate 1 is located within the orthographic projection of the gate line 3 on the base substrate 1, but an orthographic projection of a middle portion of the second curved portion 8312 on the base substrate 1 is not overlapped with the orthographic projection of the gate line 3 on the base substrate 1.

The conductive enhancement layer 821 and the protective layer 831 are recessed and bent to reserve space for the first spacer 141. Since the first spacer 141 is used to support the color filter substrate 13, a relatively flat support plane needs to be provided, then it is necessary to provide a relatively flat base plane for the first spacer 141. The conductive enhancement layer 821 and the protective layer 831 will cause the base plane on which the first spacer 141 is disposed to be uneven. In a case where the conductive enhancement layer 821 and the protective layer 831 are recessed and bent, there is no need to dispose the first spacer 141 on the side of the conductive enhancement layer 821 and the protective layer 831 away from the base substrate 1, and the relatively flat base plane is provided for the first spacer 141.

It should be noted that, the above-mentioned curve is not necessarily only formed by arcs, and may also be formed by a polyline consisting of a plurality of straight lines, or may be formed by a mixture of straight lines and arcs.

The curved conductive enhancement layer 821 and the curved protective layer 831 have sufficient extension margin, which can effectively avoid the breakage of the conductive enhancement layer 821 and the protective layer 831.

The second insulating layer 111 is disposed on the side of the protective layer 831 away from the base substrate 1, and the fourth via hole 112 is disposed in the second insulating layer 111. The fourth via hole 112 is in communication with the third via hole 812, that is, the fourth via hole 112 is also in communication with the data line 5.

The second electrode 12 is disposed on the side of the second insulating layer 111 away from the base substrate 1, and the second electrode 12 is coupled to the data line 5 through the fourth via hole 112, the third via hole 812, the second via hole 72 and the first via hole 62. The second electrode 12 may be the pixel electrode.

In addition, in other embodiments of the present disclosure, the second electrode 12 may be disposed on the side of the organic insulating layer 71 away from the base substrate 1, the second electrode 12 may be the pixel electrode, and the second electrode 12 is coupled to the data line 5 through the first via hole 62 in the first insulating layer 61 and the second via hole 72 in the organic insulating layer 71. The second insulating layer 111 is disposed on the side of the second electrode 12 away from the base substrate 1, and the first electrode 811, the conductive enhancement layer 821 and the protective layer 831 are sequentially stacked on the side of the second insulating layer 111 away from the base substrate 1. The structures of the first electrode 811, the conductive enhancement layer 821 and the protective layer 831 have been described in detail above, which will not repeated here.

In some other embodiments of the present disclosure, the extension direction of the conductive enhancement layer 821 may be consistent with the extension direction of the data line 5, and the orthographic projection of the conductive enhancement layer 82 on the base substrate 1 is at least partially located within the orthographic projection of the data line 5 on the base substrate 1. The extension direction of the protective layer 831 may also be consistent with the extension direction of the data line 5, and the orthographic projection of the protective layer 831 on the base substrate 1 is at least partially located within the orthographic projection of the data line 5 on the base substrate 1. For example, the conductive enhancement layer 821 and the data line 5 may be disposed on a portion of the data line 5 where the first spacer 141 is not disposed, and the conductive enhancement layer 821 and the data line 5 may be disconnected and disposed in multiple sections.

In still other embodiments of the present disclosure, the extension direction of the conductive enhancement layer 821 may be consistent with the extension direction of the gate line 3, and the conductive enhancement layer 821 may be located on a side of the thin film transistor away from the gate line 3, that is, the conductive enhancement layer 821 and the gate line 3 are located on opposite sides of the thin film transistor. The extension direction of the protective layer 831 can also be consistent with the extension direction of the gate line 3, and the protective layer 831 can be located on the side of the thin film transistor away from the gate line 3, that is, the protective layer 831 and the gate line 3 are located on opposite sides of the thin film transistor.

Based on the same inventive concept, the embodiments of the present disclosure further provide a manufacturing method for a display panel. Referring to FIG. 17, the manufacturing method for the display panel may include the following steps S110 to S210.

In the step S110, an array substrate 15 is provided, and the array substrate 15 is manufactured by the manufacturing method described in any one of the above embodiments.

In the step S210, the color filter substrate 13 is provided, and the color filter substrate 13 is oppositely aligned with the array substrate 15. The color filter substrate 13 includes the black matrix 132, the orthographic projection of the conductive enhancement layer 821 on the base substrate 1 is located within an orthographic projection of the black matrix 132 on the base substrate 1, and the orthographic projection of the protective layer 831 on the base substrate 1 is located within the orthographic projection of the black matrix 132 on the base substrate 1.

In the manufacturing method for the display panel of the present disclosure, since both the protective layer 831 and the conductive enhancement layer 821 are made of metal materials, they are opaque and reflective, and they are blocked by the black matrix 132 to prevent their reflection from affecting the display effect.

In the embodiments of the present disclosure, after an alignment mark on the array substrate 15 is aligned with an alignment mark on the color filter substrate 13, the array substrate 15 and the color filter substrate 13 are oppositely aligned (that is, cell-assembled), so that the orthographic projection of the conductive enhancement layer 821 on the base substrate 1 is located within the orthographic projection of the black matrix 132 on the base substrate 1, and the orthographic projection of the protective layer 831 on the base substrate 1 is located within the orthographic projection of the black matrix 132 on the base substrate 1. In addition, a liquid crystal material is added to a gap between the array substrate 15 and the color filter substrate 13 to form a display panel.

Based on the same inventive concept, the embodiments of the present disclosure further provide a display panel. Referring to FIG. 18, the display panel may include the array substrate 15 and the color filter substrate 13. The array substrate 15 is the array substrate 15 described in any of the above embodiments, and a specific structure of the array substrate 15 has been described in detail above, and therefore will not be repeated here. The color filter substrate 13 is disposed opposite to the array substrate 15, and the color filter substrate 13 may include the black matrix 132. The orthographic projection of the conductive enhancement layer 821 on the base substrate 1 is located within the orthographic projection of the black matrix 132 on the base substrate 1.

In the embodiments of the present disclosure, the color filter substrate 13 may further include a base layer 131, and a plurality of filter portions 133 and the black matrix 132 disposed on a side of the base layer 131. The plurality of filter portions 133 are arranged in an array on the side of the base layer 131, and may include red filter portions, blue filter portions, and green filter portions.

A second spacer 142 is disposed on a side of the color filter substrate 13 close to the array substrate 15. The second spacer 142 can also be disposed in a strip shape. After the array substrate 15 and the color filter substrate 13 are oppositely aligned, the second spacer 142 and the first spacer 141 are in contact and form a criss-cross structure. The second spacer 142 and the first spacer 141 together support the color filter substrate 13 and provide an accommodation space for the liquid crystal.

Based on the same inventive concept, the embodiments of the present disclosure further provide a display device, which may include the above-mentioned display panel. A specific structure of the display panel has been described in detail above, and therefore will not be repeated here.

A specific type of the display device is not particularly limited, and any type of display device commonly used in the art is possible, which specifically, for example, mobile devices such as mobile phones, wearable devices such as watches, VR devices, etc. Those skilled in the art can make corresponding selections according to a specific use of the display device, which will not be repeated here.

It should be noted that in addition to the display panel, the display device also includes other necessary parts and components. Taking a display as an example, components such as a housing, a circuit board, a power wire and the like can be included. Those skilled in the art can make corresponding supplements according to specific usage requirements of the display device, which will not be repeated here.

Compared to the prior art, beneficial effects of the display device provided by the embodiments of the present disclosure are the same as the beneficial effects of the array substrate 15 provided by the above-described embodiments, which will not be repeated here.

Other embodiments of the present disclosure will be apparent to those skilled in the art after those skilled in the art consider the specification and practice the invention disclosed herein. The present disclosure is intended to cover any variations, uses, or adaptations of the present disclosure, which are in accordance with the general principles of the present disclosure and include common general knowledge or conventional technical means in the art that are not disclosed in the present disclosure. The specification and embodiments are only regarded as illustrative, and the real scope and spirit of the present disclosure is defined by the appended claims.

What is claimed is:

1. A manufacturing method for an array substrate, comprising:

forming a first electrode material layer, a conductive enhancement material layer and a protective material layer in sequence, wherein oxidation resistance of the protective material layer is stronger than oxidation resistance of the conductive enhancement material layer;

forming a mask pattern on a side of the protective material layer away from the first electrode material layer, wherein the mask pattern comprises a first portion and a second portion, and a thickness of the first portion is greater than a thickness of the second portion;

performing ashing on the mask pattern to remove the second portion to expose the protective material layer covered by the second portion;

patterning the first electrode material layer to form a first electrode; and patterning the protective material layer and the conductive enhancement material layer to form a protective layer and a conductive enhancement layer correspondingly.

2. The manufacturing method for the array substrate according to claim 1, wherein before the performing the ashing on the mask pattern, the manufacturing method further comprises:

patterning the protective material layer and the conductive enhancement material layer to expose a part of the first electrode material layer.

3. The manufacturing method for the array substrate according to claim 1, wherein the forming the mask pattern on the side of the protective material layer away from the first electrode material layer comprises:

forming a mask layer on the side of the protective material layer away from the first electrode material layer; and performing a half-mask process on the mask layer to form the mask pattern.

4. The manufacturing method for the array substrate according to claim 1, wherein before the forming the first electrode material layer, the manufacturing method further comprises:

forming an organic insulating material layer; and patterning the organic insulating material layer to form an organic insulating layer and a second via hole.

5. The manufacturing method for the array substrate according to claim 1, wherein before the forming the first electrode material layer, the manufacturing method further comprises:

forming a gate line and a thin film transistor on a side of a base substrate, wherein an orthographic projection of the conductive enhancement layer on the base substrate is at least partially overlapped with an orthographic projection of the gate line on the base substrate, and an orthographic projection of the protective layer on the base substrate is at least partially overlapped with the orthographic projection of the gate line on the base substrate;

wherein the first electrode, the conductive enhancement layer and the protective layer are disposed on a side the thin film transistor away from the base substrate.

6. The manufacturing method for the array substrate according to claim 5, wherein after the forming the protective layer and the conductive enhancement layer, the manufacturing method further comprises:

forming a second insulating layer on a side of the protective layer away from the first electrode, and patterning the second insulating layer to form a fourth via hole; and forming a second electrode on a side of the second insulating layer away from the first electrode, wherein the second electrode is electrically coupled with a data line of the thin film transistor.

7. A manufacturing method for a display panel, comprising:

providing an array substrate, wherein the array substrate is manufactured by a manufacturing method, wherein the manufacturing method comprises:

forming a first electrode material layer, a conductive enhancement material layer and a protective material layer in sequence, wherein oxidation resistance of the protective material layer is stronger than oxidation resistance of the conductive enhancement material layer;

forming a mask pattern on a side of the protective material layer away from the first electrode material layer, wherein the mask pattern comprises a first portion and a second portion, and a thickness of the first portion is greater than a thickness of the second portion;

performing ashing on the mask pattern to remove the second portion to expose the protective material layer covered by the second portion;

patterning the first electrode material layer to form a first electrode; and patterning the protective material layer and the conductive enhancement material layer to form a protective layer and a conductive enhancement layer correspondingly; and providing a color filter substrate, and oppositely aligning the color filter substrate with the array substrate, wherein the color filter substrate comprises a black matrix, and an orthographic projection of the conductive enhancement layer on a base substrate is located within an orthographic projection of the black matrix on the base substrate, and an orthographic projection of the protective layer on the base substrate is located within the orthographic projection of the black matrix on the base substrate.

8. An array substrate, comprising:

a first electrode;

a conductive enhancement layer, disposed on a side of the first electrode; and a protective layer, disposed on a side of the conductive enhancement layer away from the first electrode, wherein oxidation resistance of the protective layer is stronger than oxidation resistance of the conductive enhancement layer, wherein the array substrate further comprises:

a base substrate;

a thin film transistor and a gate line, disposed on a side of the base substrate, wherein an orthographic projection of the conductive enhancement layer on the base substrate is at least partially overlapped with an orthographic projection of the gate line on the base substrate, and an orthographic projections of the protective layer on the base substrate is at least partially overlapped with the orthographic projection of the gate line on the base substrate; and a first spacer, disposed on a side of the first electrode away from the base substrate, and located between the thin film transistor and an adjacent thin film transistor;

wherein the first electrode, the conductive enhancement layer and the protective layer are disposed on a side the thin film transistor away from the base substrate; and the orthographic projection of the conductive enhancement layer on the base substrate is set as a curve, and the conductive enhancement layer is recessed and bent to a side away from the first spacer at a position of the conductive enhancement layer adjacent to the first spacer.

9. The array substrate according to claim 8, wherein an orthographic projection of the conductive enhancement layer on the first electrode is coincided with an orthographic projection of the protective layer on the first electrode.

10. The array substrate according to claim 8, wherein the array substrate comprises:

a data line, disposed on a side of the base substrate;

an extension direction of the conductive enhancement layer is consistent with an extension direction of the data line, and the orthographic projection of the conductive enhancement layer on the base substrate is at least partially within an orthographic projection of the data line on the base substrate; and an extension direction of the protective layer is consistent with the extension direction of the data line, and an orthographic projection of the protective layer on the base substrate is at least partially within the orthographic projection of the data line on the base substrate.

11. The array substrate according to claim 8, wherein an extension direction of the conductive enhancement layer is consistent with an extension direction of the gate line; and an extension direction of the protective layer is consistent with the extension direction of the gate line.

12. The array substrate according to claim 8, wherein the array substrate further comprises:

an organic insulating layer, disposed between the thin film transistor and the first electrode.

13. The array substrate according to claim 12, wherein the array substrate further comprises:

a second insulating layer, disposed on a side of the first electrode away from the base substrate; and a second electrode, disposed on a side of the second insulating layer away from the base substrate, wherein the second electrode is electrically coupled to a data line of the thin film transistor.

14. The array substrate according to claim 8, wherein a material of the protective layer is a titanium alloy, and a thickness of the protective layer is greater than or equal to 300 A and less than or equal to 500 A;

a material of the conductive enhancement layer is copper, and a thickness of the conductive enhancement layer is greater than or equal to 1000 A and less than or equal to 1500 A; and the first electrode is a common electrode, and a material of the first electrode is ITO.

15. The array substrate according to claim 14, wherein the titanium alloy comprises at least three metal materials.

16. The array substrate according to claim 8, wherein an extension direction of the conductive enhancement layer is consistent with an extension direction of the gate line, and an extension direction of the protective layer is consistent with the extension direction of the gate line.

17. The array substrate according to claim 16, wherein the orthographic projection of the protective layer on the base substrate is set as a curve, and the protective layer is recessed and bent to the side away from the first spacer at a position of the protective layer adjacent to the first spacer.

18. The array substrate according to claim 17, wherein the conductive enhancement layer comprises a first straight portion and a first curved portion, and an orthographic projection of the first straight portion on the base substrate is located within the orthographic projection of the gate line on the base substrate, an orthographic projection of the first curved portion on the base substrate is at least partially not overlapped with the orthographic projection of the gate line on the base substrate; and the protective layer comprises a second straight portion and a second curved portion, an orthographic projection of the second straight portion on the base substrate is located within the orthographic projection of the gate line on the base substrate, and an orthographic projection of the second curved portion on the base substrate is at least partially not overlapped with the orthographic projection of the gate line on the base substrate.

19. The array substrate according to claim 16, wherein a plurality of strips of conductive enhancement layers are disposed, and the plurality of strips of conductive enhancement layers are extended in a same direction; and a plurality of strips of protective layers are disposed, and the plurality of strips of protective layers are extended in a same direction.

* * * * *